(12) United States Patent
Schubert

(10) Patent No.: US 8,530,909 B2
(45) Date of Patent: Sep. 10, 2013

(54) ARRAY ASSEMBLIES WITH HIGH VOLTAGE SOLID STATE LIGHTING DIES

(75) Inventor: Martin F. Schubert, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 144 days.

(21) Appl. No.: 12/978,722

(22) Filed: Dec. 27, 2010

(65) Prior Publication Data
US 2012/0161161 A1    Jun. 28, 2012

(51) Int. Cl.
*H01L 33/48*    (2010.01)
*H01L 33/08*    (2010.01)

(52) U.S. Cl.
USPC .............. 257/88; 257/E33.001; 257/E33.056; 438/28

(58) Field of Classification Search
USPC ................ 257/80, 88, 98, E33.001, E33.056; 438/28; 349/65
See application file for complete search history.

(56) References Cited

U.S. PATENT DOCUMENTS

| | | | |
|---|---|---|---|
| 7,535,028 | B2 | 5/2009 | Fan et al. |
| 7,714,348 | B2 | 5/2010 | Fan et al. |
| 7,821,023 | B2 | 10/2010 | Yuan et al. |
| 2008/0280384 | A1 | 11/2008 | Hung et al. |
| 2009/0174337 | A1 | 7/2009 | Miskin et al. |
| 2010/0133554 | A1 | 6/2010 | Hussell |
| 2010/0155746 | A1 | 6/2010 | Ibbetson et al. |
| 2010/0224890 | A1 | 9/2010 | Keller et al. |

OTHER PUBLICATIONS

International Search Report and Written Opinion issued Jul. 10, 2012 in International Application No. PCT/US2011/064895, 8 pages.

*Primary Examiner* — Victor A Mandala
*Assistant Examiner* — Whitney T Moore
(74) *Attorney, Agent, or Firm* — Perkins Coie LLP

(57) ABSTRACT

Various embodiments of solid state lighting ("SSL") assemblies with high voltage SSL dies and methods of manufacturing are described herein. In one embodiment, an array assembly of SSL dies includes a first terminal and a second terminal configured to receive an input voltage (Vo). The array assembly also includes a plurality of SSL dies coupled between the first terminal and the second terminal, at least some of which are high voltage SSL dies coupled in parallel.

22 Claims, 4 Drawing Sheets

ARRAY ASSEMBLIES WITH HIGH VOLTAGE SOLID STATE LIGHTING DIES

TECHNICAL FIELD

The present disclosure is related to array assemblies with high voltage solid state lighting ("SSL") dies and associated methods of manufacturing.

BACKGROUND

Different types of light emitting diodes ("LEDs") can have different forward built-in voltages (or junction voltages). For example, gallium nitride/indium gallium nitride (GaN/InGaN) based blue and green LED dies typically operate at a forward built-in voltage of about 3 volts direct current ("DC"). Aluminum indium gallium phosphide (AlInGaP) based LED dies may have a forward built-in voltage around 2 volts DC. To supply power to the LED dies, power supplies typically include AC/DC rectifiers, DC/DC converters, power conditioners, and/or other suitable components. Such power supplies, however, can operate more efficiently when a difference between their output voltage and input voltage is smaller. Thus, LEDs operating at higher voltages (e.g., 24 volts, 48 volts, etc.) than the forward built-in voltage of 3 volts are often desired.

One conventional technique of achieving high input voltage in LEDs is serially coupling a plurality of LED dies in an array. For example, four GaN/InGaN LED dies may be serially coupled to operate at 12 volts, or eight GaN/InGaN LED dies may be serially coupled to operate at 24 volts. However, such a technique limits the number of possible array configurations. For example, with 3-volt GaN/InGaN LED dies, the possible number of LED dies in an array has to be 16 or 32 for an input voltage of 48 volts, and 20 or 40 for an input voltage of 60 volts.

LED dies typically operate most efficiently around an "optimal" flux level per unit area (commonly represented as lumen/die area) due to a peak in efficiency corresponding to a particular current density in the LED dies. By limiting the possible number of LED dies in an array based on the input voltage, the LED dies may not operate at the "optimal" flux level. For example, in a 700 lumen array operating at 24 volts, the array may include 8 or 16 LED dies with each LED die having a flux level of 84 or 42 lumens/die area, respectively. If the "optimal" flux level is 60 lumens/die area, then neither configuration is "optimal." Accordingly, improved techniques may be desirable for forming arrays of SSL devices to accommodate high input voltages while at least approximating the "optimal" flux level per unit area.

DETAILED DESCRIPTION

Various embodiments of SSL devices, assemblies, and methods of manufacturing are described below. As used hereinafter, the term "SSL device" generally refers to devices with LEDs, laser diodes ("LDs"), and/or other suitable sources of illumination other than electrical filaments, a plasma, or a gas. The term "built-in voltage" or "junction voltage" generally refers to an electrical potential across a depletion region in a semiconductor material at or near a depletion equilibrium. A person skilled in the relevant art will also understand that the technology may have additional embodiments and that the technology may be practiced without several of the details of the embodiments described below with reference to FIGS. 1A-4.

Figure 1A:
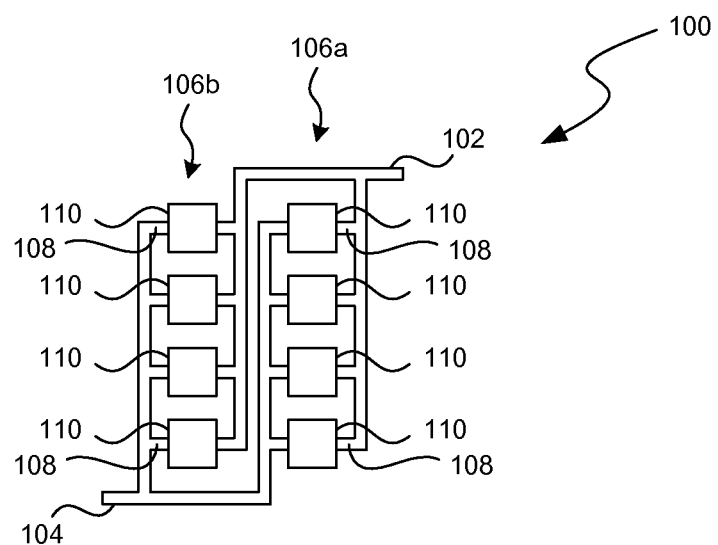
FIGS. 1A and 1B are schematic block diagrams of an array assembly of SSL dies in accordance with embodiments of the present technology.

FIG. 1A is a schematic block diagram of an array assembly 100 of SSL dies 110 in accordance with embodiments of the present technology. As shown in FIG. 1A, the array assembly 100 includes a first terminal 102, a second terminal 104, and a plurality of SSL dies 110 coupled in parallel between the first and second terminals 102 and 104. The first and second terminals 102 and 104 are configured to receive an input voltage ($V_o$) from an external power supply (not shown).

In the illustrated embodiment, the SSL dies 110 are arranged as a first string 106a and a second string 106b in parallel with each other. The first and second strings 106a and 106b individually include a plurality of branches 108 parallel to one another with each branch 108 carrying a corresponding SSL die 110. As a result, the SSL dies 110 are all arranged in parallel with one another. In other embodiments, the SSL dies 110 may be arranged into a single string and/or have other suitable configurations. In further embodiments, at least one of the branches 108 may carry more than one SSL dies in series, as discussed in more detail below with reference to FIG. 1B.

The individual SSL dies 110 can be configured to operate at higher voltage levels than a junction voltage of a single SSL device. In the following description, a GaN/InGaN LED die with a junction voltage of about 3 volts is used as an example of the single SSL device. One of ordinary skill in the relevant art will understand that the various SSL array configurations and methods of manufacturing discussed below may be equally applicable to other SSL devices with similar or different junction voltages.

In certain embodiments, the individual SSL dies 110 may include more than one LED junctions coupled in series. In the illustrated embodiment, the operating voltage of each of the SSL dies 110 is equal to the input voltage ($V_o$) at the first and second terminals 102 and 104. Thus, the total forward junction voltages ($V_{tot}$) of the junctions is equal to the input voltage ($V_o$), and the number of junctions in each of the SSL dies 110 can be calculated as follows:

$$m = \frac{V_o}{\Delta V}$$

where m is the number of junctions. For example, if the input voltage ($V_o$) is 24 volts, then the individual SSL dies 110 with a junction voltage of about 3 volts may include eight GaN/InGaN LED junctions formed in a single SSL die 110. If the input voltage ($V_o$) across the first and second terminals is 48 volts, then sixteen 3-volt GaN/InGaN LED junctions may be formed in a single SSL die 110. In other embodiments, the individual SSL dies 110 may include other numbers of junctions with a combined forward junction voltage ($V_{tot}$) less than the input voltage ($V_o$), as discussed in more detail below with reference to FIG. 1B.

In certain embodiments, the number of SSL dies 110 in the array assembly 100 may be calculated based on a total target flux ($J_{tot}$) for the array assembly 100 and a target flux per die area ($J/A_{target}$) of the SSL dies 110 as follows:

$$n = \frac{J_{tot}}{J/A_{target}}$$

where n is the number of the plurality of LED dies. For example, assuming the following design conditions are desired:
 the total target flux ($J_{tot}$)=480 lumens
 the target flux per die area ($J/A_{target}$)=60 lumens/mm$^2$
then the number of SSL dies 110 (n) may be calculated as follows:

$$n = \frac{J_{tot}}{J/A_{target}} = \frac{480}{60} = 8$$

Thus, the array assembly 100 may include eight SSL dies 110 arranged parallel to one another.

In the foregoing example, the total target flux ($J_{tot}$) is evenly divisible by the target flux per die area ($J/A_{target}$). In other examples, the total target flux ($J_{tot}$) may not be evenly divisible by the target flux per die area ($J/A_{target}$), and thus the number of SSL dies 110 in the array assembly 100 may be determined in an iterative manner. For example, assuming the following design conditions are desired:
 the total target flux ($J_{tot}$)=700 lumens
 the target flux per die area ($J/A_{target}$)=60 lumens/mm$^2$
then dividing the total target flux ($J_{tot}$) by the target flux per die area ($J/A_{target}$) gives 11.667. Thus, by setting the initial number of SSL dies 110 (n) to 11, the actual flux per die area (J/A) can be calculated as follows:

$$J/A = \frac{J_{tot}}{n} = \frac{700}{11} = 63.64$$

The actual flux per die area (J/A) can then be compared to the target flux per die area ($J/A_{target}$) to determine if the actual flux per die area is within a predetermined threshold of the target value.

If the actual flux per die area (J/A) is within the predetermined threshold, then the current value of the number of SSL dies 110 may be used; otherwise, the number of SSL dies 110 may be adjusted until the actual flux per die area (J/A) converges. For example, if the predetermined threshold is 2 lumens/mm$^2$, then the value of the actual flux per die area (J/A) of 63.64 lumens/mm$^2$ exceeds the threshold. As a result, the number of SSL dies 110 (n) may be adjusted. In one embodiment, the number of SSL dies 110 (n) may be increased by a predetermined amount (e.g., one, two, or other suitable integer numbers). In other embodiments, the number of SSL dies 110 (n) may be decreased by the predetermined amount. In further embodiments, the number of SSL dies 110 (n) may be alternately increased and decreased.

In one example, the number of SSL dies 110 (n) is increased by one. Thus, the actual flux per die area (J/A) can be calculated as follows:

$$J/A = \frac{J_{tot}}{n} = \frac{700}{12} = 58.33$$

Comparing the calculated actual flux per die area (J/A) of 58.33 lumens/mm$^2$ to the target flux per die area ($J/A_{target}$) of 60 lumens/mm$^2$ shows that the calculated value is within the threshold of 2 lumens/mm$^2$ from the target value. Thus, the current value (i.e., 12) of the number of SSL dies 110 may be used for the array assembly 100.

Several embodiments of the array assembly 100 can be made more efficient than conventional arrays by decoupling the number of SSL dies 110 from the operating voltage of the individual SSL dies 110. For example, as discussed in above in the Background section, in a 700 lumen conventional array operating at 24 volts, the array can include 8 or 16 LED dies with each LED die having a flux level of 84 or 42 lumens/die area, respectively. The conventional array cannot have other die configurations because the input voltage ($V_o$) of 24 volts dictates how many dies (i.e., 8, 16, or other multiples of 8) must be in the array. In contrast, in the above example, to achieve the same flux level, the array assembly 100 can include 12 SSL dies 110 each having 8 LED junctions and having a flux level of 58.33 lumens/mm$^2$, which is much closer to the target flux per die area ($J/A_{target}$) of 60 lumens/mm$^2$ than 84 or 42 lumens/die area. As a result, the array assembly 100 may operate more efficiently than conventional arrays.

Several embodiments of the array assembly 100 can be more flexible than conventional arrays in accommodating different total target flux ($J_{tot}$) values. For example, if the total target flux ($J_{tot}$) is now 800 lumens, in the conventional array, the number of LED dies cannot change because of the constant input voltage ($V_o$). Thus, each LED die in the conventional array must change to a flux level of 100 or 50 lumens/die area, respectively. These flux levels are still far away from the target flux per die area ($J/A_{target}$) of 60 lumens/mm$^2$. In contrast, in several embodiments of the array assembly 100, to achieve 800 lumens, the array assembly 100 may include one more SSL die 110 coupled in parallel to the other 12 SSL dies 110. Each of the SSL dies 110 has a flux level of 61.53 lumens/mm$^2$, indicating more efficient operation than the conventional array.

Figure 1B:
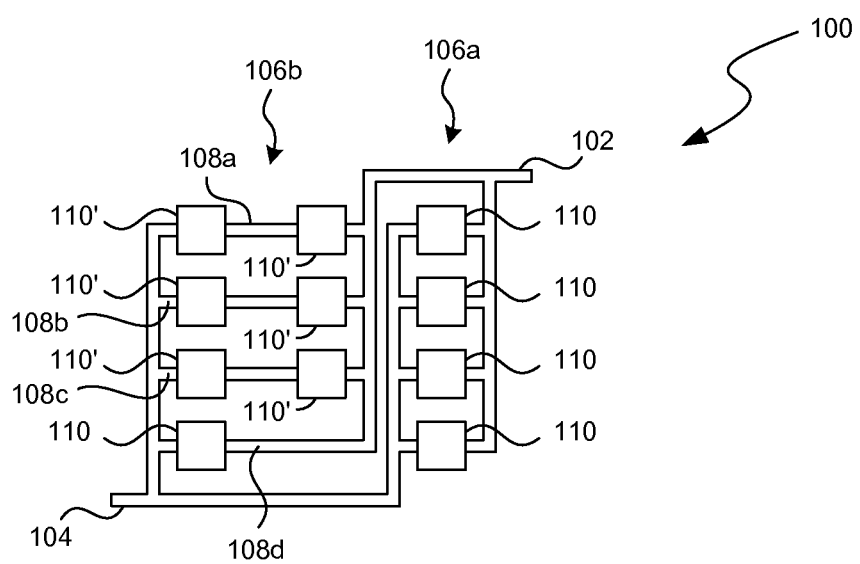

Even though the array assembly 100 in FIG. 1A includes one SSL die 110 in each branch 108, as shown in FIG. 1B, in other embodiments, at least one of the branches 108 (identified individually as first, second, third, and fourth branches 108a, 108b, 108c, and 108d, respectively) may include two SSL dies 110 coupled in series. In the illustrated embodiment, the first, second, and third branches 108a, 108b, and 108c carry two low voltage SSL dies 110', and the fourth branch 108d carries one high voltage SSL die 110 in the second string 106b. As used hereinafter, the phrases "high voltage" and "low voltage" indicate relative voltage levels between each other. Thus, a single voltage level (e.g., 12 volts) may be considered a "high voltage" when the other voltage is 6 volts but a "low voltage" when the other voltage is 24 volts. In other embodiments, the array assembly 100 may include branches 108 carrying three, four, or any other desired number of low voltage SSL dies 110'.

In the illustrated embodiment, the individual low voltage SSL dies 110' have an operating voltage of one half of the input voltage ($V_o$). The individual high voltage SSL dies 110 have an operating voltage that generally equals the input voltage ($V_o$). Even though the high voltage and low voltage SSL dies 110 and 110' have different operating voltage levels, the individual high voltage and low voltage SSL dies 110 and 110' can have generally similar flux per die area values. For example, the array assembly 100 in FIG. 1B includes eleven dies that are a mixture of high voltage and low voltage SSL dies 110 and 110'. Thus, the flux per die area for both the high voltage and low voltage SSL dies 110 and 110' can be 63.64 lumens/mm². In other embodiments, the high voltage and low voltage SSL dies 110 and 110' can have different flux per die area values.

Figure 2A:
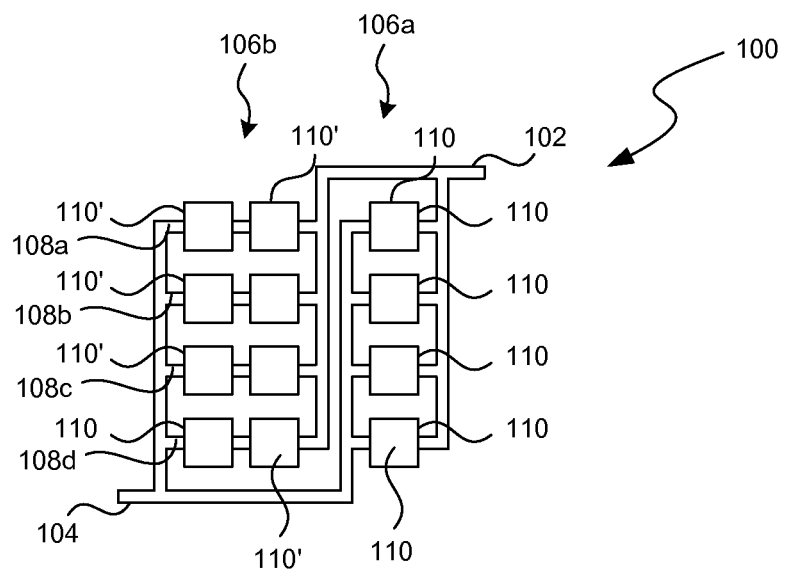
FIGS. 2A and 2B are schematic block diagrams of an array assembly of SSL dies in accordance with additional embodiments of the present technology.
Figure 2B:
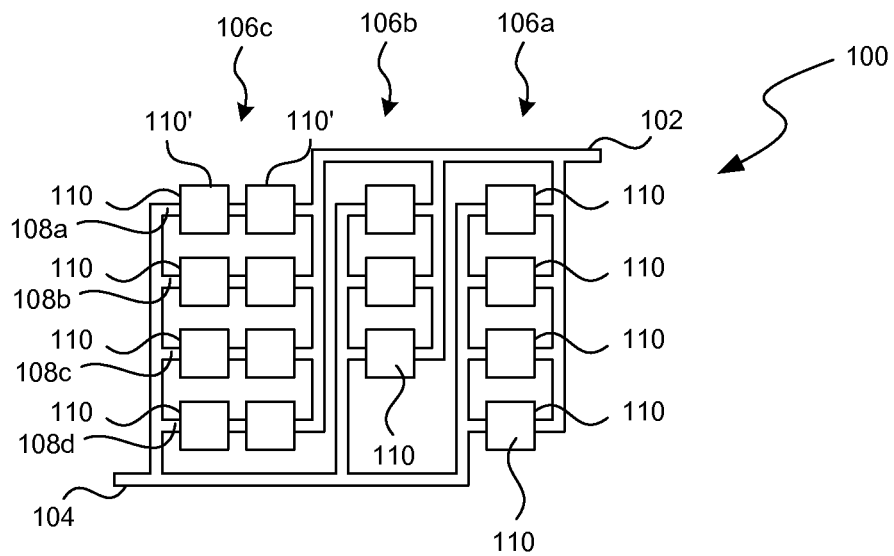

Even though only particular string/branch configurations are illustrated in FIGS. 1A and 1B, in other embodiments the array assembly 100 can have other suitable string and/or branch configurations. For example, as shown in FIG. 2A, each of the branches 108a-108d in the second string 106b carry two low voltage SSL dies 110'. As shown in FIG. 2B, the array assembly 100 can include first, second, and third strings 106a-106c with the third string 106c having branches 108a-108d, each carrying two low voltage SSL dies 110'.

Figure 3A:
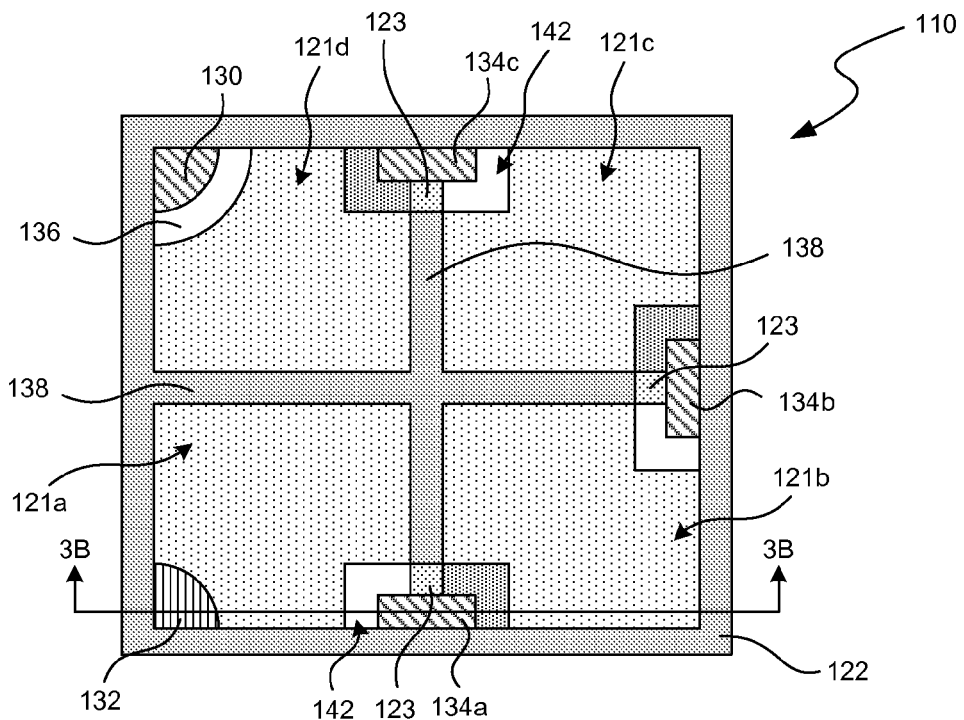
FIG. 3A is a top plan view of a multi junction SSL die suitable for use in the array assemblies of FIGS. 1A-2B.
Figure 3B:
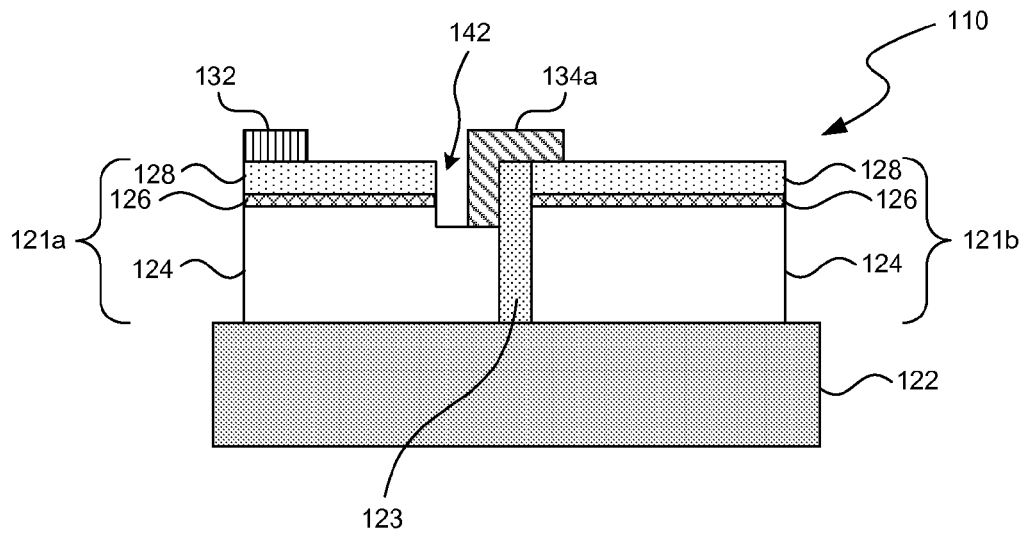
FIG. 3B is a cross-sectional view of the SSL die in FIG. 3A.

FIG. 3A is a top plan view of a multi junction SSL die 110 suitable for use in the array assemblies of FIGS. 1A-2B. FIG. 3B is a cross-sectional view of the SSL die 110 in FIG. 3A. Referring to both FIGS. 3A and 3B together, the SSL die 110 can include a substrate 122 carrying a plurality of SSL structures 121 (identified individually as first-fourth SSL structures 121a-121d, respectively) that are electrically isolated from one another by an insulating material 123. Even though only four SSL structures 121a-121d are shown in FIG. 3, in other embodiments, the SSL die 110 can include two, three, five, and/or other suitable numbers of SSL structures 121. In further embodiments, the SSL die 110 can also include a lens, a mirror, and/or other suitable optical and/or electrical components.

In one embodiment, the substrate 122 can include a metal, a metal alloy, a doped silicon, and/or other electrically conductive substrate materials. For example, in one embodiment, the substrate 122 can include copper, aluminum, and/or other suitable metals. In other embodiments, the substrate 122 can also include a ceramic material, a silicon, a polysilicon, and/or other generally nonconductive substrate materials. Even though the substrate 122 is shown to carry only one SSL structure 121, in other embodiments, two, three, or any other desired number of SSL structures 121 may be formed on the substrate 122.

In certain embodiments, the insulating material 123 can include silicon oxide ($SiO_2$), silicon nitride ($Si_3N_4$), and/or other suitable nonconductive materials formed on the substrate 122 via thermal oxidation, chemical vapor deposition ("CVD"), atomic layer deposition ("ALD"), and/or other suitable techniques. In other embodiments, the insulating material 123 can include a polymer (e.g., polytetrafluoroethylene and/or other fluoropolymer of tetrafluoroethylene), an epoxy, and/or other polymeric materials.

As shown in FIGS. 3A and 3B, the SSL structures 121 are arranged in a 2×2 array with channels 138 (FIG. 3A) separating adjacent SSL structures 121. The individual SSL structures 121 include a notch 142 through which a portion of a first semiconductor material 124 is exposed. An interconnect 134 (identified individually as first-third interconnects 134a-134c, respectively) electrically connect two adjacent SSL structures 121 through the corresponding notch 142. As such, the first-fourth SSL structures 121a-121d are serially coupled to one another.

The SSL structures 121 are configured to emit light and/or other types of electromagnetic radiation in response to an applied electrical voltage. In the embodiment illustrated in FIG. 3B, the SSL structures 121 individually include the first semiconductor material 124, an active region 126, and a second semiconductor material 128. The SSL structures 121 also include a first electrode 130 (FIG. 3A) and a second electrode 132. The first electrode 130 is located on the first semiconductor material 124 through a gap 136 in the active region 126 and the second semiconductor material 128 in the fourth SSL structure 121d. The second electrode 132 is located on the second semiconductor material 128 of the first SSL structure 121a. In other embodiments, the SSL structures 121 can also include silicon nitride, aluminum nitride (AlN), and/or other suitable intermediate materials.

In certain embodiments, the first semiconductor material 124 can include N-type GaN (e.g., doped with silicon (Si)), and the second semiconductor material 128 can include P-type GaN (e.g., doped with magnesium (Mg)). In other embodiments, the first semiconductor material 124 can include P-type GaN, and the second semiconductor material 128 can include N-type GaN. In further embodiments, the first and second semiconductor materials 124 and 128 can individually include at least one of gallium arsenide (GaAs), aluminum gallium arsenide (AlGaAs), gallium arsenide phosphide (GaAsP), gallium(III) phosphide (GaP), zinc selenide (ZnSe), boron nitride (BN), aluminum gallium nitride (AlGaN), and/or other suitable semiconductor materials.

The active region 126 can include a single quantum well ("SQW"), multiple quantum wells (MQWs), and/or a bulk semiconductor material. As used hereinafter, a "bulk semiconductor material" generally refers to a single grain semiconductor material (e.g., InGaN) with a thickness greater than about 10 nanometers and up to about 500 nanometers. In certain embodiments, the active region 126 can include an InGaN SQW, GaN/InGaN MQWs, and/or an InGaN bulk material. In other embodiments, the active region 126 can include aluminum gallium indium phosphide (AlGaInP), aluminum gallium indium nitride (AlGaInN), and/or other suitable materials or configurations.

In certain embodiments, at least one of the first semiconductor material 124, the active region 126, and the second semiconductor material 128 can be formed on the substrate material 122 via metal organic chemical vapor deposition ("MOCVD"), molecular beam epitaxy ("MBE"), liquid phase epitaxy ("LPE"), and hydride vapor phase epitaxy ("HVPE"). In other embodiments, at least one of the foregoing components and/or other suitable components (not shown) of the SSL structure 121 may be formed via other suitable epitaxial growth techniques.

Figure 4:
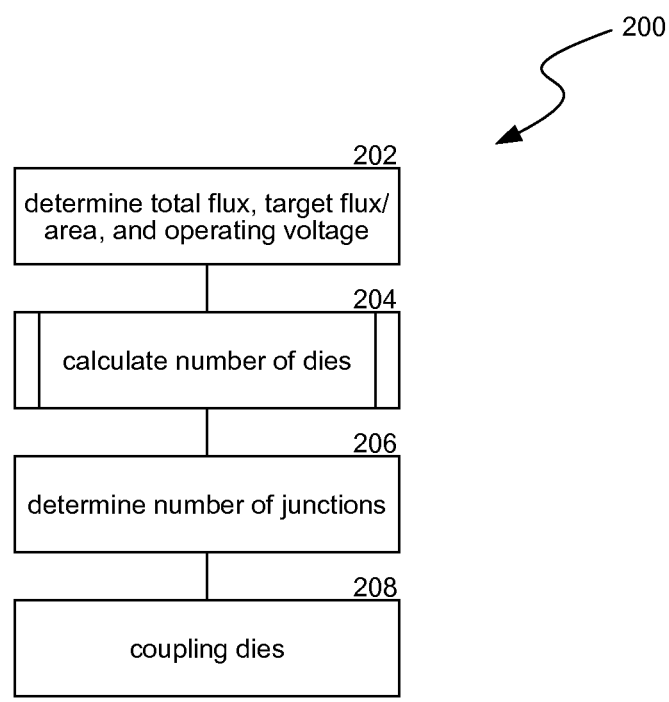
FIG. 4 is a flowchart of a method of manufacturing an array assembly of SSL dies in accordance with embodiments of the present technology.

FIG. 4 is a flowchart of a method 200 of manufacturing an array assembly of SSL dies in accordance with embodiments of the present technology. As shown in FIG. 4, an initial stage (block 202) of the method 200 can include determining a total flux ($J_{tot}$), a target flux/die area ($J/A_{target}$), and an input voltage ($V_o$) to the array assembly. In one embodiment, the foregoing parameters may be determined by product specifications, market demand, and/or other conditions. In other embodiments, at least one of the foregoing parameters may have an initialized value in an iterative calculation.

Another stage (block 204) of the method 200 includes calculating a number of SSL dies for the array assembly based at least in part on the total flux ($J_{tot}$) and the target flux/die area ($J/A_{target}$). In one embodiment, the number of LED dies for the array assembly can be calculated as follows:

$$n = \frac{J_{tot}}{J/A_{target}}$$

where n is the number of the plurality of LED dies. In another embodiment, the number of SSL dies for the array assembly can be calculated as follows:

$$n = \frac{J_{tot}}{J/A_{target}}$$

where the brackets [ ] denote an integer quotient of $$\frac{J_{tot}}{J/A_{target}}.$$

In further embodiments, the number of SSL dies may be $$\left[\frac{J_{tot}}{J/A_{target}}\right] + 1$$

or may have other suitable values determined using an iterative technique as discussed in more detail above with reference to FIG. 1A.

A further stage (block 206) of the method 200 can include determining a number of junctions in the individual SSL dies based at least in part on the input voltage ($V_o$), and another stage (block 208) can include coupling the calculated number of SSL dies with the determined number of junctions in parallel. In one embodiment, the number of junctions for the individual LED dies can be determined as follows:

$$m = \frac{V_o}{\Delta V}$$

where m is the number of junctions in the individual SSL dies, and $\Delta V$ is a forward junction voltage of a single junction. In other embodiments, the number of junctions in the individual SSL dies can be determined as follows:

$$m = \frac{V_o}{k\Delta V}$$

where k is a positive integer.

From the foregoing, it will be appreciated that specific embodiments of the technology have been described herein for purposes of illustration, but that various modifications may be made without deviating from the disclosure. In addition, many of the elements of one embodiment may be combined with other embodiments in addition to or in lieu of the elements of the other embodiments. Accordingly, the disclosure is not limited except as by the appended claims.

I claim:

1. An array assembly of solid state lighting (SSL) dies, comprising:
   a first terminal;
   a second terminal, the first terminal and the second terminal being configured to receive an input voltage ($V_o$); and
   a plurality of SSL dies coupled between the first terminal and the second terminal with at least a pair of the SSL dies being coupled in parallel and biased in the same direction, wherein:
   the plurality of SSL dies individually include a plurality of junctions with a total forward junction voltage ($V_{tot}$) less than or generally equal to the input voltage ($V_o$); and
   the individual SSL dies have a value of flux/die area (J/A) that is within a threshold of a target value of flux/die area (J/A$_{target}$).

2. The array assembly of claim 1 wherein:
   a number of the plurality of SSL dies is equal to a total target flux ($J_{tot}$) divided by the target value of flux/die area (J/A$_{target}$) as follows:

$$n = \frac{J_{tot}}{J/A_{target}}$$

where n is the number of the plurality of SSL dies;
   the individual SSL dies have a total forward junction voltage ($V_{tot}$) that is generally equal to the input voltage ($V_o$);
   a number of junctions in the individual SSL dies is as follows:

$$m = \frac{V_o}{\Delta V}$$

where m is the number of junctions in the individual SSL dies and $\Delta V$ is a forward junction voltage of a single junction; and
   all of the plurality of SSL dies are coupled between the first terminal and the second terminal in parallel to one another.

3. The array assembly of claim 1 wherein:
   the plurality of SSL dies individually include a plurality of junctions coupled in series; and
   the total forward junction voltage ($V_{tot}$) of the individual SSL dies is as follows:

$$V_{tot} = m \times \Delta V$$

where m is a number of junctions in the individual SSL dies and $\Delta V$ is a forward junction voltage of a single junction.

4. The array assembly of claim 1 wherein:
   a number of the plurality of SSL dies is equal to a total target flux ($J_{tot}$) divided by the target value of flux/die area (J/A$_{target}$) as follows:

$$n = \frac{J_{tot}}{J/A_{target}}$$

where n is the number of the plurality of SSL dies.

5. The array assembly of claim 1 wherein:
   a number of the plurality of SSL dies is equal to a total target flux ($J_{tot}$) divided by the target value of flux/die area (J/A$_{target}$) as follows:

$$n = \frac{J_{tot}}{J/A_{target}} + 1$$

where n is the number of the plurality of SSL dies.

6. The array assembly of claim 1 wherein:
   a number of junctions in the individual SSL dies is as follows:

$$m = \frac{V_o}{\Delta V}$$

where m is the number of junctions in the individual SSL dies and ΔV is a forward junction voltage of a single junction; and all of the plurality of SSL dies are coupled between the first terminal and the second terminal in parallel to one another.

7. The array assembly of claim 1 wherein:
the plurality of SSL dies are arranged as multiple strings individually having multiple SSL dies coupled in series; and
the individual SSL dies have a total forward junction voltage ($V_{tot}$) that is less than the input voltage ($V_o$).

8. The array assembly of claim 1 wherein:
the plurality of SSL dies are arranged as multiple strings individually having multiple SSL dies coupled in series;
the individual SSL dies have a total forward junction voltage ($V_{tot}$) that is less than the input voltage ($V_o$); and
a number of junctions in the individual SSL dies is as follows:

$$m = \frac{V_{tot}}{\Delta V}$$

where m is the number of junctions in the individual SSL dies and ΔV is a forward junction voltage of a single junction.

9. The array assembly of claim 1 wherein all of the plurality of SSL dies include the same number of junctions.

10. The array assembly of claim 1 wherein at least some of the plurality of SSL dies include a number of junctions different than the other SSL dies.

11. The array assembly of claim 1, further comprising:
a first string having a first portion of the plurality of SSL dies arranged in series; and
a second string in parallel with the first string, and the second string having a second portion of the plurality of dies arranged in series.

12. The array assembly of claim 1, further comprising:
a plurality of strings individually arranged in parallel with one another, wherein each of the plurality of strings has two or more branches arranged in parallel, and wherein each branch carries at least one of the plurality of SSL dies;
wherein at least one of the plurality of branches carries two or more of the plurality of SSL dies arranged in series.

13. An array assembly of solid state lighting (SSL) dies, comprising:
a first terminal;
a second terminal, the first terminal and the second terminal being configured to receive an input voltage ($V_o$);
a plurality of SSL dies coupled between the first terminal and the second terminal, the plurality of SSL dies individually having a plurality of junctions coupled in series with a total forward junction voltage ($V_{tot}$) greater than a forward junction voltage (ΔV) of a single junction but less than or generally equal to the input voltage ($V_o$);
all of the plurality of SSL dies are coupled in parallel to one another and biased in the same direction; and
the total forward junction voltage ($V_{tot}$) of the individual SSL dies is as follows:

$$V_{tot} = V_o$$

a number of junctions in the individual SSL dies is as follows:

$$m = \frac{V_o}{\Delta V}$$

where m is the number of junctions in the individual SSL dies.

14. The array assembly of claim 1, wherein:
at least some of the SSL dies are coupled in series;
the input voltage ($V_o$) is a multiple of the total forward junction voltage ($V_{tot}$) of the individual SSL dies as follows:

$$V_o = k \times V_{tot}$$

where k is a positive integer; and
a number of junctions in the individual SSL dies is as follows:

$$m = \frac{V_o}{k \Delta V}$$

where m is the number of junctions in the individual SSL dies.

15. The array assembly of claim 1 wherein all of the plurality of SSL dies have a generally similar value of flux/die area (J/A).

16. The array assembly of claim 1 wherein at least one of the plurality of SSL dies has a value of flux/die area (J/A) different than other SSL dies.

17. A method of manufacturing an array assembly of solid state lighting (SSL) dies, comprising:
determining a total flux ($J_{tot}$), a target flux/die area ($J/A_{target}$), and an input voltage ($V_o$) of the array assembly;
calculating a number of SSL dies for the array assembly based at least in part on the total flux ($J_{tot}$) and the target flux/die area ($J/A_{target}$);
determining a number of junctions in the individual SSL dies based at least in part on the input voltage ($V_o$); and
coupling the calculated number of SSL dies with the determined number of junctions between a first terminal and a second terminal in parallel and biased in the same direction.

18. The method of claim 17 wherein calculating a number of SSL dies includes:
calculating the number of SSL dies for the array assembly as follows:

$$n = \frac{J_{tot}}{J/A_{target}}$$

where n is the number of the plurality of SSL dies.

19. The method of claim 17 wherein calculating a number of SSL dies includes:
calculating the number of SSL dies for the array assembly as follows:

$$n = \left[ \frac{J_{tot}}{J/A_{target}} \right] + 1$$

where n is the number of the plurality of SSL dies.

20. The method of claim 17 wherein calculating a number of SSL dies includes:

calculating a number (n) of SSL dies for the array assembly as follows:

$$n = \left[\frac{J_{tot}}{J/A_{target}}\right]$$

calculating a value of flux/die area (J/A) based on the total flux ($J_{tot}$) and the calculated number of SSL dies as follows:

$$J/A = \frac{J_{tot}}{n}$$

comparing the calculated value of flux/die area (J/A) to a target value of flux/die area ($J/A_{target}$);

if the calculated value of flux/die area (J/A) is within a threshold of the target value of flux/die area ($J/A_{target}$), then setting the number of SSL dies to n; and if the calculated value of flux/die area (J/A) is not within the threshold of the target value of flux/die area ($J/A_{target}$), then setting n=n+1 or n=n−1, and repeating the calculating of the value of flux/die area (J/A) and comparing of the calculated value of flux/die area (J/A) to the target value of flux/die area ($J/A_{target}$).

21. The method of claim 17 wherein determining a number of junctions includes:

determining the number of junctions for the individual SSL dies as follows:

$$m = \frac{V_o}{\Delta V}$$

where m is the number of junctions in the individual SSL dies.

22. The method of claim 17 wherein determining a number of junctions includes:

determining the number of junctions for the individual SSL dies as follows:

$$m = \frac{V_o}{k\Delta V}$$

where m is the number of junctions in the individual SSL dies and k is a positive integer.

* * * * *

UNITED STATES PATENT AND TRADEMARK OFFICE
CERTIFICATE OF CORRECTION

PATENT NO. : 8,530,909 B2  Page 1 of 1
APPLICATION NO. : 12/978722
DATED : September 10, 2013
INVENTOR(S) : Martin F. Schubert It is certified that error appears in the above-identified patent and that said Letters Patent is hereby corrected as shown below:

On Title Page, Item (57), under "Abstract", column 2, line 5, delete "(Vo)." and insert -- $(V_o)$. --, therefor.

In the Claims

In column 10, line 10, in Claim 14, delete "claim 1," and insert -- claim 1 --, therefor.

In column 11, line 27, in Claim 20, delete "$(J/A_{target})_5$" and insert -- $(J/A_{target})$, --, therefor.

Signed and Sealed this
Twenty-sixth Day of November, 2013

Margaret A. Focarino
*Commissioner for Patents of the United States Patent and Trademark Office*

UNITED STATES PATENT AND TRADEMARK OFFICE
CERTIFICATE OF CORRECTION

PATENT NO. : 8,530,909 B2
APPLICATION NO. : 12/978722
DATED : September 10, 2013
INVENTOR(S) : Martin F. Schubert Page 1 of 1

It is certified that error appears in the above-identified patent and that said Letters Patent is hereby corrected as shown below:

In the Claims:

In column 10, line 10, in Claim 14, delete "claim 1" and insert -- claim 13 -- therefor.

In column 10, line 27, in Claim 15, delete "claim 1" and insert -- claim 13 -- therefor.

In column 10, line 30, in Claim 16, delete "claim 1" and insert -- claim 13 -- therefor.

Signed and Sealed this
First Day of July, 2014

Michelle K. Lee
*Deputy Director of the United States Patent and Trademark Office*